(12) United States Patent
Allory et al.

(10) Patent No.: US 11,043,949 B2
(45) Date of Patent: Jun. 22, 2021

(54) PROGRAMMABLE LOGIC CIRCUIT FOR CONTROLLING AN ELECTRICAL FACILITY, IN PARTICULAR A NUCLEAR FACILITY, ASSOCIATED CONTROL DEVICE AND METHOD

(71) Applicant: FRAMATOME, Courbevoie (FR)

(72) Inventors: Mathieu Allory, Bry-sur-Marne (FR); Nicolas Dupuy, Issy les Moulineaux (FR)

(73) Assignee: FRAMATOME, Courbevoie (FR)

( * ) Notice: Subject to any disclaimer, the term of this patent is extended or adjusted under 35 U.S.C. 154(b) by 107 days.

(21) Appl. No.: 16/492,112

(22) PCT Filed: Mar. 8, 2018

(86) PCT No.: PCT/EP2018/055817
§ 371 (c)(1),
(2) Date: Sep. 7, 2019

(87) PCT Pub. No.: WO2018/162668
PCT Pub. Date: Sep. 13, 2018

(65) Prior Publication Data
US 2021/0083671 A1    Mar. 18, 2021

(30) Foreign Application Priority Data
Mar. 8, 2017   (FR) ..................... 17 51903

(51) Int. Cl.
*G21D 3/00*        (2006.01)
*H03K 19/17728*    (2020.01)
(Continued)

(52) U.S. Cl.
CPC ......... *H03K 19/17728* (2013.01); *G21D 3/00* (2013.01); *G21D 3/001* (2013.01);
(Continued)

(58) Field of Classification Search
CPC ....... H03K 19/0175; H03K 19/017581; H03K 19/1772; H03K 19/17724;
(Continued)

(56) References Cited

U.S. PATENT DOCUMENTS 6,449,732 B1 * 9/2002 Rasmussen ............. G05B 9/03
                                              713/400
7,870,299 B1 * 1/2011 Sorensen ............ G06F 11/1004
                                              710/2
(Continued)

FOREIGN PATENT DOCUMENTS

EP          3107212 A1    12/2016

OTHER PUBLICATIONS

Corresponding Search Report PCT/EP2018/055817.
Battle R et al: "Reactor Protection System Design Using Application Specific Integrated Circuits", Instrumentation in the Power Industry, Proceed, vol. 35, Jun. 1, 1992, pp. 389-396.

*Primary Examiner* — Jason Crawford
(74) *Attorney, Agent, or Firm* — Davidson, Davidson & Kappel, LLC

(57) ABSTRACT

A programmable logic circuit (10) for controlling an electrical facility, in particular a nuclear facility, includes an operating unit (14). The operating unit includes a plurality of types of functional blocks ($FB_1$, $FB_i$, $FB_N$), two distinct types of functional blocks being suitable for executing at least one distinct function, at least one processing module suitable for receiving at least one sequence (46) of functional block(s) to be executed, and at least one internal memory (38) configured to store at least said sequence (46). The programmable logic circuit (10) includes a single functional block of each type, a given functional block being suitable for being called several times, and an execution module (22) configured to execute the called functional block(s) in series, according to said sequence (46).

18 Claims, 4 Drawing Sheets

(51) Int. Cl.
*H03K 19/17736* (2020.01)
*H03K 19/17704* (2020.01)
*H03K 19/1776* (2020.01)

(52) U.S. Cl.
CPC ..... *H03K 19/1772* (2013.01); *H03K 19/1776* (2013.01); *H03K 19/17744* (2013.01)

(58) Field of Classification Search
CPC ....... H03K 19/17728; H03K 19/17744; H03K 19/1776; G06F 13/10; G06F 13/122; G06F 13/124; G06F 5/01; G06F 5/012; G21D 3/00; G21D 3/001; G21D 3/002; G05B 2219/161
See application file for complete search history.

(56) References Cited

U.S. PATENT DOCUMENTS

| | | | |
|---|---|---|---|
| 2002/0052673 A1 | 5/2002 | Seong et al. | |
| 2004/0010324 A1* | 1/2004 | Bednar | G05B 9/03 700/6 |
| 2014/0096097 A1* | 4/2014 | Prasanna | G06F 30/30 716/107 |
| 2015/0204944 A1* | 7/2015 | Hamada | H03K 19/17764 326/16 |
| 2018/0191352 A1* | 7/2018 | Weber | H03K 19/17748 |
| 2020/0343009 A1* | 10/2020 | Clarkson | G21D 3/001 |

* cited by examiner

PROGRAMMABLE LOGIC CIRCUIT FOR CONTROLLING AN ELECTRICAL FACILITY, IN PARTICULAR A NUCLEAR FACILITY, ASSOCIATED CONTROL DEVICE AND METHOD

This application is an application claiming the benefit of French Application No. 17 51903, filed on Mar. 8, 2017, which is incorporated herein by reference in its entirety.

The present disclosure relates to a programmable logic circuit for controlling an electrical facility, in particular a nuclear facility, the programmable logic circuit comprising an operating unit comprising:

a plurality of types of functional blocks, two distinct types of functional block(s) being suitable for executing at least one distinct function, at least one processing module suitable for receiving at least one sequence of functional blocks to be executed, and at least one internal memory configured to store at least said sequence.

Furthermore, the present disclosure also relates to a control device for controlling an electrical facility, in particular a nuclear facility, the control device comprising at least one such programmable logic circuit.

Additionally, the present disclosure also relates to a method for controlling an electrical facility, implemented, at least in part, by the aforementioned control device for controlling an electrical facility.

BACKGROUND

Known from document EP 2,988,420 A1 is a system for controlling an electrical facility based on an electronic board comprising two FPGA (Field Programmable Gate Array) programmable logic circuits.

A first FPGA serves as master and comprises a set of functional blocks comprising as many functional blocks of the same type, for example of the "AND" type, as the number of instances of this type of block for a given control command application of a nuclear facility. The second FPGA is connected point-to-point to the inputs and outputs of the first FPGA and serves as physical connection matrix of the functional blocks of the first FPGA.

Upon each modification of the considered control command application or in case of change of control command application, a reprogramming in VHDL (very high speed integrated circuit (VHSIC) hardware description language (HDL)) or Verilog and a requalification of the second FPGA connecting the functional blocks to one another is necessary.

Indeed, in a nuclear facility control command context, each FPGA design must be very carefully qualified by using complex development and verification processes.

Such a step for reprogramming in hardware description language, VHDL or Verilog, for example, requires that the operator be familiar with this language, and the requalification requires verification time and effort.

In order to offset these drawbacks, a solution is described in document EP 3,107,212 A1 and based on the implementation of an FPGA also comprising a set of functional blocks executed in parallel according to several successive cycles in order to obtain the result of a given control command application of a nuclear facility. According to this solution, the FPGA circuit comprises at least as many functional blocks of the same type as the number of instances of this type of block. Furthermore, in this document, a data conveyor makes it possible to cause binary and analog values to pass between the functional blocks each having a specific architecture respectively allowing them to extract their input and output data from the conveyor, and send them to the conveyor.

However, this solution requires a large number of functional blocks of the same type and defined empirically from the experience acquired during design of the nuclear facility control command system. Furthermore, the execution in parallel of the functional blocks during several successive cycles that are necessary in order to obtain the result associated with an application requires the implementation of a synchronization, in particular using time delay(s), so as to guarantee the determinism of the data passing between each functional block and between each cycle.

SUMMARY

An aim of the present disclosure is therefore to provide an alternative solution, for the control command of a nuclear facility, based on the implementation of a programmable logic circuit for which, in case of control command application change, a reprogramming in VHDL or a requalification of the processing module is avoided, while reducing the number of logic resources implemented and while more simply meeting the deterministic safety demonstration demands required for a safety device, such as a control device of a nuclear facility.

To that end, a programmable logic circuit of the aforementioned type is provided, wherein the programmable logic circuit comprises a single functional block of each type, a given functional block being suitable for being called several times, and an execution module configured to execute the called functional block(s) in series, according to said sequence.

The programmable logic circuit according to the present disclosure then makes it possible to significantly reduce the number of logic resources and therefore the size and the energy consumption of the programmable logic circuit, while guaranteeing the determinism of the control command application owing to the execution in series of the called functional blocks according to their sequence (i.e., order) of execution during a single cycle (a cycle corresponding to a time during which the input data of the programmable logic circuit is fixed in memory and will only be reevaluated during a following cycle). In other words, according to the present invention, a single cycle, corresponding to the execution of the series of functional blocks listed in the sequence, is necessary to obtain the result of a given control command application.

According to other advantageous aspects of the present disclosure, the programmable logic circuit comprises one or several of the following features, considered alone or according to all technically possible combinations:

the programmable logic circuit is of the FPGA type;
the execution module is a finite-state machine;
the operating unit further comprises a plurality of parallelizable floating point units;
at least one processing module is suitable for receiving an application program corresponding to a group of computer configuration files comprising said sequence and at least one other computer file belonging to the group comprising:
a configuration file of the memory corresponding to a table associating, with at least one input/output signal of the programmable logic circuit, an address in its memory, a file with value(s) of parameter(s) of functional block(s) suitable for executing at least one function using a parameter, a file listing, for each functional block, the address or addresses of the memory allocated to one or more input(s) of this functional block, a file listing, for each functional block, the address or addresses of the memory allocated to one or more output(s) of this functional block;

the parameter values are sequenced within their file as a function of said sequence of functional block(s) to be executed;

the memory comprises at least two data storage areas respectively dedicated to binary data and analog data;

each storage area comprises at least three dedicated subareas;
- at least one subarea dedicated to the input data of the programmable logic circuit,
- at least one subarea dedicated to the output data of the programmable logic circuit,
- at least one subarea dedicated to temporary data obtained during execution of said sequence;

the subareas dedicated to the input data or the subareas dedicated to the output data are synchronous flip-flop registers.

The present disclosure also provides a control device as defined above.

According to other advantageous aspects of the present disclosure, the control device comprises one or several of the following features, considered alone or according to all technically possible combinations:

the control device comprises a plurality of programmable logic circuits of the aforementioned type;

the control device further comprises:
- at least one power module;
- auxiliary modules among one or several modules dedicated to acquiring distinct input data, one or several modules dedicated to publishing distinct output data, and one or several service maintenance diagnosis modules, and
- a communication bus configured to link the programmable logic circuit(s) to the auxiliary modules;

the communication bus comprises four multipoint-low voltage differential signaling (M-LVDS) links respectively dedicated to the input data and the output data of each programmable logic circuit in each transmission direction;

the control device comprises a fiber-optic communication network configured to link the plurality of programmable logic circuits;

control device wherein each master programmable logic circuit, among the plurality of programmable logic circuits, is suitable for being connected to a clock and is configured to synchronize the other programmable logic circuits of the plurality of programmable logic circuits by means of the fiber-optic communication network;

control device wherein the master programmable logic circuit is also configured to synchronize the auxiliary modules by means of the communication bus;

control device wherein the plurality of programmable logic circuits is housed in a same rack;

control device wherein the programmable logic circuits of the plurality of programmable logic circuits are separated in at least two distinct racks.

The present disclosure also provides a control method of an electrical facility, implemented, at least in part, by the control device of an electrical facility comprising a programmable logic circuit comprising an operating unit comprising:
- a plurality of types of functional blocks, two distinct types of functional blocks being suitable for executing at least one distinct function,
- at least one processing module suitable for receiving at least one sequence of functional block(s) to be executed,
- at least one internal memory configured to store at least said sequence, the programmable logic circuit comprising a single functional block of each type, a single functional block being suitable for being called several times, and comprising an execution module configured to execute, in series, the called functional block(s) according to said sequence, the method comprising at least:
- the reception of at least one sequence of functional block(s) to be executed,
- the execution in series of the called functional block(s) according to said sequence.

According to other advantageous aspects of the present disclosure, the control method comprises one or several of the following features, considered alone or according to all technically possible combinations:

the implementation of the method is distributed over several distinct entities, namely an application program generator of a maintenance plan, and a control device of the aforementioned type comprising at least one service maintenance diagnosis module and at least one programmable logic circuit of the aforementioned type;

the method further comprising:
- programming functional blocks of the programmable logic circuit(s),
- developing a library file describing the characteristics of the functions able to be implemented by each functional block as programmed, and storing said library file in a memory of an application program generator;
- developing function charts showing a control command application of the electrical facility using a graphic publisher connected to the application program generator,
- converting data of the function charts via the application program generator into at least one sequence of functional blocks to be executed, each functional block of the sequence implementing the functions according to those previously programmed and indexed in the library file,
- connecting the application program generator to the control device of an electrical facility via a service maintenance diagnosis module,
- loading at least the sequence of functional blocks to be executed into the control device;

the library file comprises, for each programmed functional block:
- its type,
- the description of at least one function that it is suitable for implementing,
- its identifier corresponding to a predetermined hardware description language code,
- its number and/or type of inputs,
- its number and/or type of output,
- its number and/or type of parameter(s) that it is suitable for using.

BRIEF SUMMARY OF THE DRAWINGS

These features and advantages of the invention will appear upon reading the following description, provided solely as a non-limiting example, and done in reference to the appended drawings, in which.

DETAILED DESCRIPTION

Figure 1:
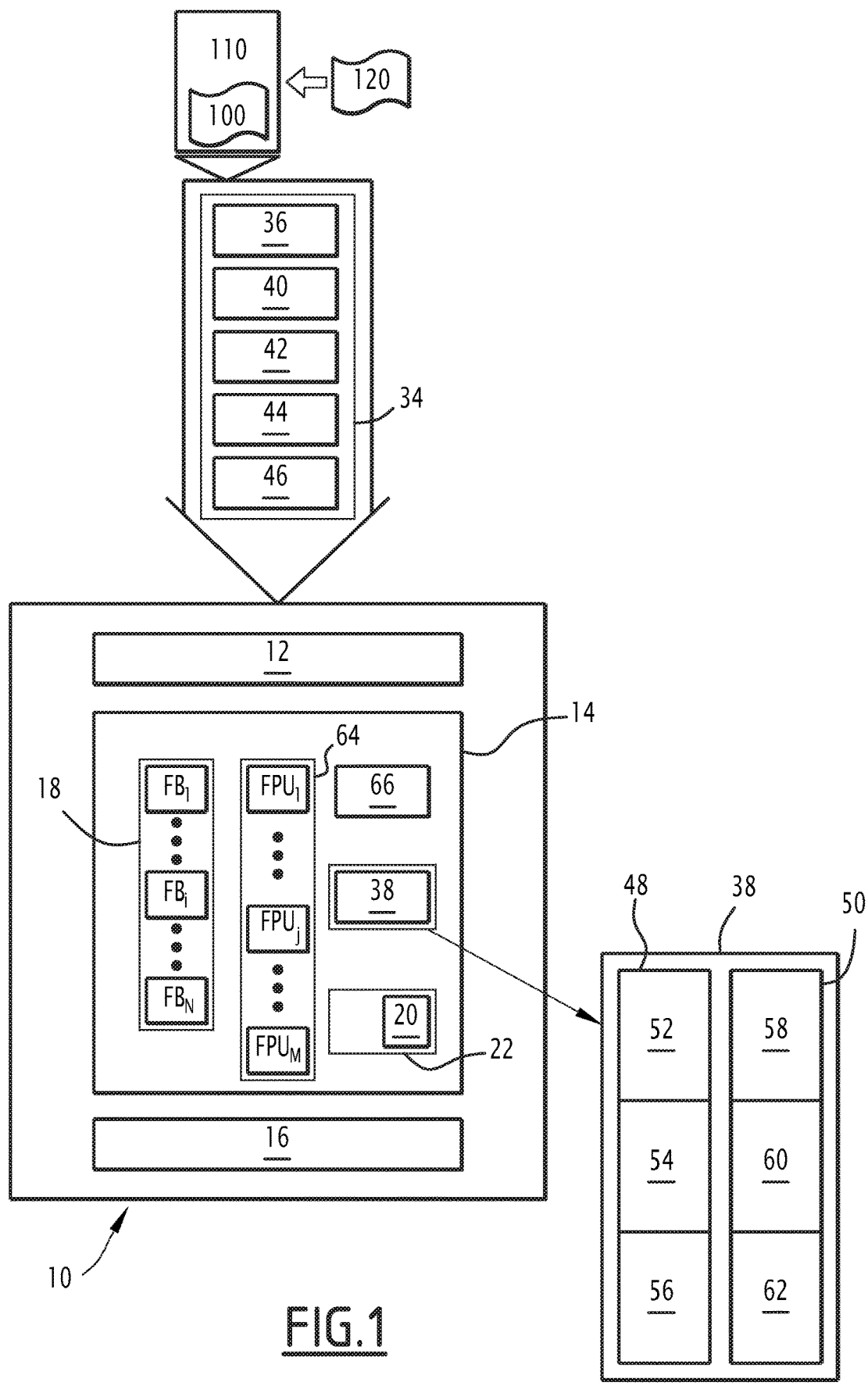
FIG. 1 is a schematic illustration of a programmable logic circuit according to an embodiment of the invention.

In FIG. 1, the programmable logic circuit 10 is a processing module (PM). More specifically, the programmable logic circuit 10 is made in the form of an electronic structure, such as a field programmable gate array (FPGA).

Such an FPGA 10 comprises a module 12 for controlling input signals, an operating unit 14 (OPU), and a module 16 for controlling output signals.

The operating unit 14 comprises a plurality 18 of N types of distinct functional blocks $FB_1, \ldots FB_i, \ldots, FB_N$ with N an integer and I the functional block type index between one and N.

Two distinct functional block types are suitable for executing at least one distinct function. "Function" refers to a function suitable for being implemented by an FPGA.

According to the present disclosure, the operating unit comprises a single functional block of each type.

Each functional block is also qualified once and for all during the design of the programmable logic circuit and, according to the present disclosure, is subsequently only called to be executed during a control command application without any requalification being necessary in case of change/modification of control command application.

Each block instance may further have, if necessary, a dedicated internal memory space 20 of an execution module 22 of the operating unit 14, making it possible to store values that are persistent from one execution cycle to the next.

The set of functions suitable for being implemented by an FPGA according to the present disclosure are therefore implemented (i.e., programmed according to a preliminary step) once and for all in VHDL. Their characteristics are for example listed and stored within a library file 100 stored within a memory of an automatic generator 110 of configuration data of a maintenance unit 76 (illustrated in FIG. 3) distant and distinct from the programmable logic circuit 10 according to the present disclosure.

In other words, the library file 100 describes the characteristics of the functions able to be implemented by each functional block as programmed.

Such a library file 100 for example comprises, for each functional block:
  its type,
  the description of at least one function that it is suitable for implementing,
  its identifier corresponding to a predetermined arbitrary code,
  its number and/or type of inputs,
  its number and/or type of outputs,
  its number and/or type of parameters that it is suitable for using.

Such a library file 100 is developed beforehand and used by an automatic configuration data generator of the maintenance unit 76, making it possible automatically to translate a set of functional diagrams 120 into application program 34.

Figure 2:
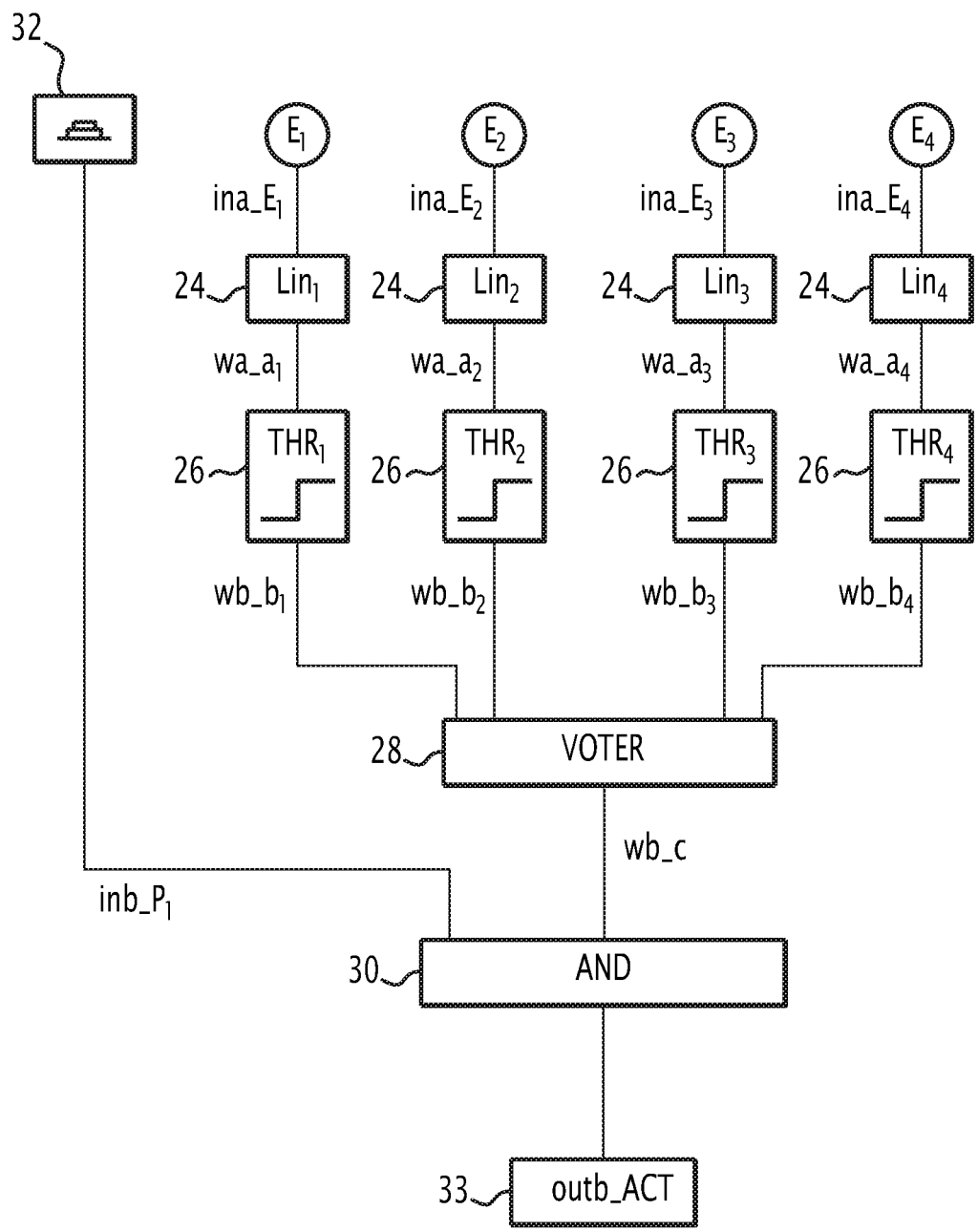
FIG. 2 is an illustration showing an exemplary control command application to be executed.

FIG. 2 illustrates a function chart 120 of an exemplary control command application to be executed. Such an application corresponds to the limit temperature detection at four distinct points of a nuclear reactor.

Such an application is generated by an operator from a graphic publisher connected to the automatic generator 110 of an application program 34 without requiring specific knowledge in VHDL or Verilog hardware description language.

The application program 34 automatic generator 110 is suitable for converting the data from such a function chart 120 by the application program 34 generator 110 into at least one sequence 46 of functional blocks to be executed, each functional block of the sequence implementing the functions according to those previously programmed and indexed in the library file 100.

Four types 24, 26, 28, 30 of distinct functional blocks are necessary for the implementation of such a control command application, namely the four types LIN, THR, VOTER and AND that are graphically connected by directed links showing the causal relationships between functional blocks.

More specifically, the operator graphically defines the number of inputs and signals of the control command application, namely E1, E2, E3 and E4, which correspond, for example, to the different measurement points of a nuclear reactor.

According to this control command application, the electrical signals of the points Ei (i=1 to 4) are next each able to be converted using a functional block of type LIN into a physical datum, here a temperature.

Then, the temperature obtained at the output of the functional block 24 of type LIN is compared to a temperature threshold using a functional block 26 of type THR having, as parameter, this temperature threshold, namely for example 100° C.

The targeted control command application next comprises a voting function implemented by functional block 28 VOTER applied to the four signals associated with each input point. The voting function is for example a 2/4 voting function able to confirm or invalidate (i.e., binary result) the comparison to the temperature threshold, once at least two out of four comparisons have the same result.

Lastly, the targeted control command application is able to take into account, using an AND functional block 30, the activation of a pushbutton 32 (able to be actuated manually by an operator) inhibiting a result. In other words, the AND functional result 30 receives two binary inputs respectively corresponding to the output signals of the pushbutton 32 and the VOTER functional block 28 and delivers, as output, the binary result 33 of the VOTER functional block if the pushbutton 32 has not been actuated, and the opposite binary result 33 otherwise.

Thus, for this control command application example, the library file 100 used by the automatic generator 110 is for example in the form of the following table:

| Type | Arbitrary code of the FB | Function description | Inputs | Outputs | Parameters |
|---|---|---|---|---|---|
| LIN | 0x01 | Linear conversion of an electrical signal into a physical datum | 1 analog | 1 analog | none |
| THR | 0x02 | Comparison to a threshold value | 1 analog | 1 binary | 1 analog: threshold value |
| VOTER | 0x03 | 2/4 voting function | 4 binary | 1 binary | none |
| AND | 0x04 | "AND" logic function between two inputs | 2 binary | 1 binary | none |

In connection with FIG. 1, the functional block $FB_1$ is for example of type LIN and code 0x01 is allocated to it on the FPGA board, functional block $FB_{i=5}$ is of type THR and code 0x02 is allocated to it, functional block $FB_{i=12}$ is of type VOTER and code 0x03 is allocated to it, and functional block $FB_{i=18}$ is of type AND and code 0x04 is allocated to it.

From the diagram shown in FIG. 2, and the library file 100 described above, a set of configuration computer files forming an application program 34 is automatically generated.

Such an application program 34 in particular comprises:
the configuration file 36 of the memory 38 of the operating unit 14 corresponding to a table associating, with at least one input/output signal of the programmable logic circuit 10, an address in its memory,
a file 40 of parameter value(s) of functional block(s) suitable for executing at least one function using a parameter,
a file 42 listing, for each functional block, the address or addresses of the memory allocated to one or several input(s) of this functional block,
a file 44 listing, for each functional block, the address or addresses of the memory allocated to one or several output(s) of this functional block,
a sequence 46 of functional block(s) to be executed.

The memory 38 of the operating unit 14 comprises at least two spaces 48 and 50 for storing data respectively dedicated to binary data (Boolean encoded on two distinct bits) and analog data (floating numbers included for example on thirty-two bits). In a variant, the memory 38 of the operating unit 14 further comprises a data storage space dedicated to the values of parameters of the file 40.

The binary data storage space 48 is in turn prioritized into at least three subspaces, namely: a first subspace 52 dedicated to the binary input data of the programmable logic circuit 10, a second subspace 54 dedicated to the temporary binary data obtained during execution of the sequence 46, a third subspace 56 dedicated to the binary output data of the programmable logic circuit.

Likewise, the analog data storage space 50 is in turn prioritized into at least three subspaces, namely: a first subspace 58 dedicated to the analog input data of the programmable logic circuit 10, a second subspace 60 dedicated to the temporary analog data obtained during execution of the sequence 46, a third subspace 58 dedicated to the analog output data of the programmable logic circuit.

The configuration file 36 of the memory 38 is configured to be read by the execution module 22 of the operating unit 14 during a single execution cycle of the control command application (for example corresponding to that shown in FIG. 2).

During the execution of the sequence 46, the execution module 22 reads, in the configuration file 36 where the values are stored, in the memory 38, the values of the inputs and outputs of the application as a whole.

In other words, the configuration file 36 is an allocation table, in the different memory subspaces (i.e., registers), of memory addresses at the inputs and outputs of the programmable logic circuit 10.

The five input values are, according to the control command application example shown in FIG. 2, with four analog values ina_E1, ina_E2, ina_E3 and ina_E4 corresponding to the electrical signals representative of temperature measurements respectively of the points E1 to E4 and binary value inb_P1 representative of the activation/deactivation of the pushbutton 32.

The output value outb_ACT is delivered after execution of the functional blocks according to the sequence 46 of functional blocks.

Thus, for this exemplary control command application illustrated in FIG. 2, the configuration file 36 is for example in the form of the following table:

| Storage space type | Analog 50 | | | | Binary 48 | |
|---|---|---|---|---|---|---|
| Subspace | Input 58 | | | | Input 52 | Output 56 |
| Memory address(es) | 0x0001 to 0x0004 | 0x0005 to 0x0008 | 0x0009 to 0x0012 | 0x0013 to 0x0014 | 0x0000 | 0xF800 |
| Name of the value | ina_E1 | ina_E2 | ina_E3 | ina_E4 | inb_P1 | outb_ACT |

According to the present disclosure, the sequence 46 of functional block(s) to be executed is a computer file listing, from the causal links of the diagram, the order of instantiation of the functional blocks to be executed in series by the execution module 22 of the operating unit 14 to perform the desired control command application.

The sequence 46 is a computer file, for example, shown in the form of the following sequenced table:

| CODE of the FB | FB_TYPE | Instance |
|---|---|---|
| 0x01 | LIN | LIN$_1$ |
| 0x02 | THR | THR$_1$ |
| 0x01 | LIN | LIN$_2$ |
| 0x02 | THR | THR$_2$ |
| 0x01 | LIN | LIN$_3$ |
| 0x02 | THR | THR$_3$ |
| 0x01 | LIN | LIN$_4$ |
| 0x02 | THR | THR$_4$ |
| 0x03 | VOTER | VOTER |
| 0x04 | AND | AND |
| 0x00 | STOP | STOP |

In other words, according to the present disclosure, a single functional block FB (the code of which is indicated in the library file previously described) is executed at a time, according to the successive instances of the series of functional blocks indicated in the computer file of sequence 46 above.

Such a serial execution guarantees the execution determinism of the control command application, since the output data of each functional block are stored and/or reinjected at the input of the following functional block over the course of the instances.

According to the prior art, to perform the control command application shown in FIG. 2, it is necessary for the FPGA to comprise four functional blocks of type LIN, four functional blocks of type THR, one functional block of type VOTER and one functional block of type AND, or in total about ten distinct functional blocks.

On the contrary, according to the present disclosure, a single functional block of each type is necessary and "called" as many times as required according to the control command application to be executed. Thus, in connection with the exemplary application of FIG. 2, the number of functional blocks necessary to execute such an application is reduced from ten to four, which allows a reduction in the size of the FPGA (i.e., optimization of the compactness) and/or the possibility of integrating functional blocks therein that are callable for other control command applications.

In other words, the hardware imprint (e.g., VHDL imprint) of the programmable logic circuit according to the disclosure is unique and permanent, a qualified functional block being suitable for being reused from one control command application to another. According to the disclosure, only the application program 34 is distinct from one control command application to another, a same functional block for example being called in first instance for a first control command application and in last instance for a second control command application different from the first.

The computer file 40 of parameter value(s) of functional blocks in turn comprises the values of the parameters necessary during the execution of the sequence 46, these parameter values being sequenced taking account of the execution sequence 46 of the functional blocks.

The computer file 40 of parameter values is shown, for example in the form of the following sequenced table:

| Parameter value | Instance of the functional block | Parameter value |
|---|---|---|
| 0x0000000042c80000 | THR$_1$ | 100.0 |
| 0x0000000042c80000 | THR$_2$ | 100.0 |
| 0x0000000042c80000 | THR$_3$ | 100.0 |
| 0x0000000042c80000 | THR$_4$ | 100.0 |

In other words, for the exemplary control command application shown in FIG. 2, the same functional block FB$_{i=5}$ of type THR is instantiated four times with the same parameter value, namely a temperature of 100° C.

According to other exemplary control command applications, different parameter values are suitable for being associated with the different instances of the functional block FB$_{i=5}$ of type THR. Thus, without modification of the hardware imprint (e.g., VHDL imprint), and as a result without requalification of the programmable circuit, the present disclosure allows a parameter change of a same functional block during the lifetime of the control command system, or from one application to another. The operating evolution of the programmable circuit is therefore made easier.

Furthermore, as previously indicated, the application program 34 also comprises two computer files 42 and 44 respectively listing, for each functional block, on the one hand, the address or addresses of the memory 38 allocated to one or several input operand(s) of this functional block, and on the other hand the address or addresses of the memory allocated to one or several output operand(s) of this functional block.

In connection with the application shown in FIG. 2, these two computer files 42 and 44 are for example respectively in the following form:

| Memory address(es) | Name of the input value | Used as input for: |
|---|---|---|
| 0x0001 | ina_E1 | LIN |
| 0x0800 | wa_a1 | THR |
| 0x0005 | ina_E2 | LIN |
| 0x0805 | wa_a2 | THR |
| 0x0009 | ina_E3 | LIN |
| 0x080A | wa_a3 | THR |
| 0x0013 | ina_a4 | THR |
| 0x080F | wa_a4 | THR |
| 0x0804 | wb_b1 | VOTER |
| 0x0809 | wb_b2 | VOTER |
| 0x080E | wb_b3 | VOTER |
| 0x0813 | wb_b4 | VOTER |
| 0x0000 | Inb_P1 | AND |
| 0x0814 | wb_c | AND 5 |

| Memory address(es) | Name of the output value | Used as output for: |
|---|---|---|
| 0x0800 | wa_a1 | LIN |
| 0x0804 | wb_b1 | THR |
| 0x0805 | wa_a2 | LIN |
| 0x0809 | wb_b2 | THR |
| 0x080A | wa_a3 | LIN |
| 0x080E | wb_b3 | THR |
| 0x080F | wa_a4 | LIN |
| 0x0813 | wb_b4 | THR |
| 0x0814 | wb_c | VOTER |
| 0xF800 | outb_ACT | AND |

The execution module 22 then operates as a finite-state machine and automatically distributes and/or stores, upon each functional block instance, the input and output values at the memory addresses indicated in the files 42 and 44 of the application program 34.

A pointer allows the execution module 22 to determine, for each functional block instance, the starting location of the addresses of the input and output values to be read in the files 42 and 44. At the end of the execution of each functional block instance, the latter updates the pointer as a function of the number of input values read and the number of output values generated, allowing the execution module 22 to determine the addresses to be read in the files 42 and 44 for the following block instance.

In other words, the computer files of the application program 34 have a synergistic effect such that the execution module 22 is configured to take all of them into account in parallel in order to implement a serial execution without any link being physically created between the different functional blocks.

Thus, in connection with the exemplary control command application illustrated in FIG. 2, the execution module 22 is configured to read the sequence 46 and to determine which is the first functional block to be executed.

This first block is the functional block $FB_1$ of type LIN, and the execution module 22 is then configured to distribute to it as input, according to the computer file 42 associated with the input data of each functional block, the analog value of ina_E1 that is stored at the address 0x0001 of the subspace 58 dedicated to the input analog data of the memory 38.

The functional block $FB_1$ of type LIN is then executed and the analog value of wa_a1 delivered as output is stored at the address 0x0800 of the memory subareas 60 dedicated to the temporary analog data according to the computer file 44 associated with the output data of each functional block.

Then, the execution module 22 is configured to read the sequence 46 and to determine which is the second functional block to be executed. This second block is the functional block $FB_{i=5}$ of type THR and the code 0x02 is allocated to it on the FPGA board. The execution module 22 is then configured to distribute to it, as input, the value of wa_a1, which is stored at the address 0x0800, as well as the value of parameter 100.0, which is the next value on the pile of values of analog parameters.

The functional block $FB_5$ of type THR is then executed and the binary value of wb_b1 delivered as output is written and stored, by the execution module 22, at the address 0x0804 of the subarea 54 dedicated to the temporary binary data.

Next, according to the sequence 46, the third functional block to be executed is again the functional block $FB_1$ of type LIN. During this second instance of this same functional block $FB_1$ of type LIN, the execution module 22 is then configured to distribute to it, as input, the analog value of ina_E2, which is stored at the address 0x0005 of the subarea 58 dedicated to the input analog data of the memory 38.

The functional block $FB_1$ of type LIN is then executed for the second time and the analog value of wa_a2 delivered as output is stored at the address 0x0805 of the memory subarea 60 dedicated to the temporary analog data, and so forth until the entire sequence 46 is completely executed (i.e., until the stop code 0x00 is read by the execution module 22).

Thus, according to the present disclosure, a single functional block is executed at a time at a given moment.

According to the example shown in FIG. 1, the operating unit 14 further comprises a plurality 64 of M parallelizable floating-point units (FPU), M being an integer.

Such units are for example suitable for implementing square root or logarithm computations and are parallelized, for the implementation of complex computations required during the execution of a functional block such as the determination of the ratio between the heat flux for the appearance of the boiling crisis and the actual heat flux in the core of a reactor, called the critical heat flux/DNBR (Departure from Nucleate Boiling Ratio) ratio. Such a pool of floating-points units is shared for all of the functional blocks of the operating unit 14 and makes it possible to accelerate the computing capacity of a functional block when the latter is configured to implement a complex analog computation. The scalability of the programmable logic circuit 10 is increased accordingly.

The operating unit 14 also comprises an input/output interface 66 suitable for receiving and retransmitting, respectively, the input data ina_E1, ina_E2, ina_E3, ina_E4 and output data inb_P1 and outb_ACT indexed in the configuration file 36, and associated with the control command application as a whole.

The interface 66 is suitable for receiving the application program 34 via an internal configuration bus (ICB) connected to the control module 12 of the input signals and sending, via this same data bus, control and diagnostic data to the control module 16 of the output signals.

The control module 12 of the input signals and the control module 16 of the output signals are outside the operating unit 14 and are suitable for communicating with apparatuses and/or circuits outside the programmable logic circuit 10.

This input signal control module 12 and this output signal control module 16 are in turn each a finite-state machine comprising one or several memory areas respectively dedicated to analog and binary data.

Among these dedicated memory areas, some are dedicated to controlling input and output data exchanged with a communication network and suitable for receiving/transmitting data sent/transmitted asynchronously in light of the operating cycle of the programmable logic circuit 10. To that end, these memory areas dedicated specifically to the network data are synchronous flip-flop registers so as to store the network data received/transmitted during the current cycle while the network data received/transmitted during the previous cycle are used by the operating unit 14 during the current cycle. The programmable logic circuit 10 therefore has a certain number of fiber-optic connectors making it possible to send/receive these data over communication networks.

Figure 3:
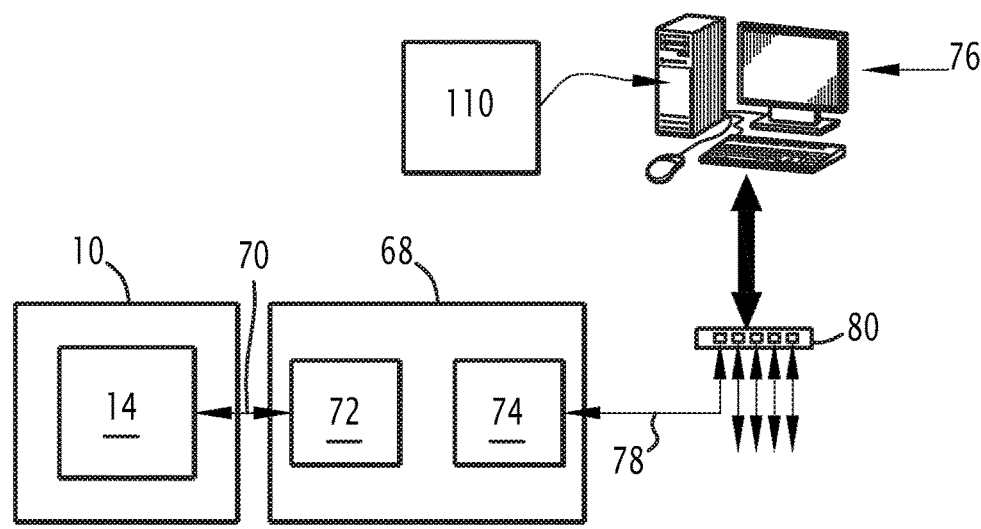
FIG. 3 is a schematic illustration of the connection of the programmable logic circuit according to an embodiment of the invention to a service maintenance diagnostic module.

The modules 12 and 16 are in particular configured to provide the communication with a service maintenance diagnosis (SMD) module 68, shown in FIG. 3.

Such a service maintenance diagnosis module 68 in particular makes it possible to load, on the programmable logic circuit 10, the application program 34 associated with the application to be executed or changes in functional block parameters (e.g., a change in temperature threshold from 100° C. to 120° C.), to launch periodic maintenance tests on the programmable logic circuit 10, or to transfer the programmable logic circuit 10 according to the disclosure to the service maintenance diagnosis module 68 of the processing data. These data exchanges between the programmable logic circuit 10 and the service maintenance diagnosis module 68 are secured using a link such as a bus 70 connected to the backplane bus of the housings respectively containing the programmable logic circuit 10 and the service maintenance diagnosis module 68.

The service maintenance diagnosis module 68 also comprises a programmable logic circuit 72, for example an FPGA, and a microprocessor 74, and is suitable for communicating according to a secure procedure with a maintenance unit 76 for example comprising the automatic generator 110, using a link 78 of the Ethernet type and a switch 80 suitable for communicating with other electrical facility control devices, a control device comprising at least one programmable logic circuit 10 according to the disclosure as previously described.

The maintenance unit 76 is for example remote from the nuclear electrical facility on which the programmable logic circuit 10 is implemented. Within this maintenance unit 76, a maintenance operator uses a graphic publisher (not requiring prior knowledge of VHDL or Verilog) to execute the control command applications to be implemented within the nuclear electrical facility, in the form of function charts 120 as shown for example in FIG. 2. As previously indicated, the function charts 120 are next converted into an application program 34, by the automatic generator 110, which uses the library file 100 to guarantee that the application program 34 will be executed without affecting the qualified configuration of the programmable logic circuit 10. The application program 34 is next loaded via the service maintenance diagnosis module 68 into the programmable logic circuit 10.

Figure 4:
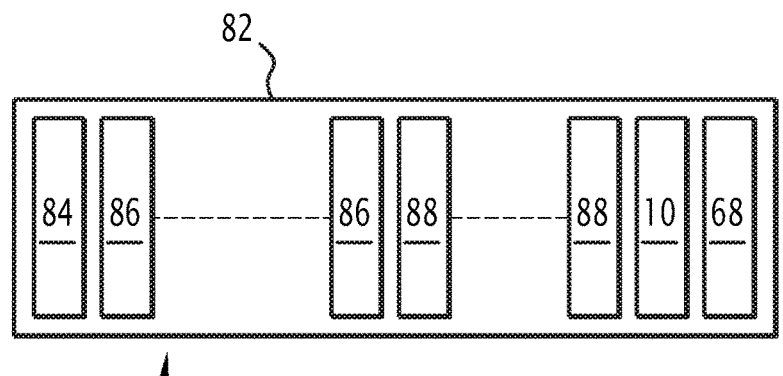
FIG. 4 is a schematic illustration of a control device according to the invention comprising, according to one embodiment, the programmable logic circuit of FIG. 1.
Figure 5:
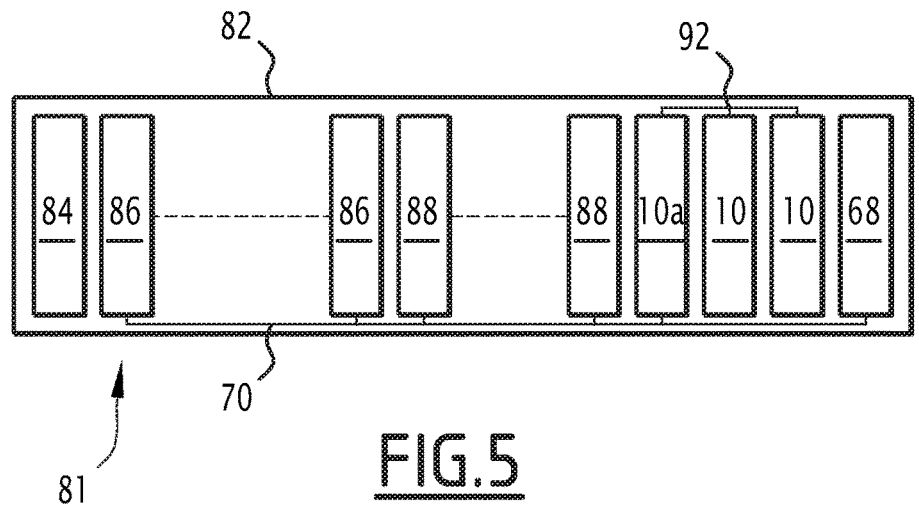
FIGS. 5 and 6 respectively show two variants of control devices comprising a plurality of programmable logic circuits shown in FIG. 1.
Figure 6:
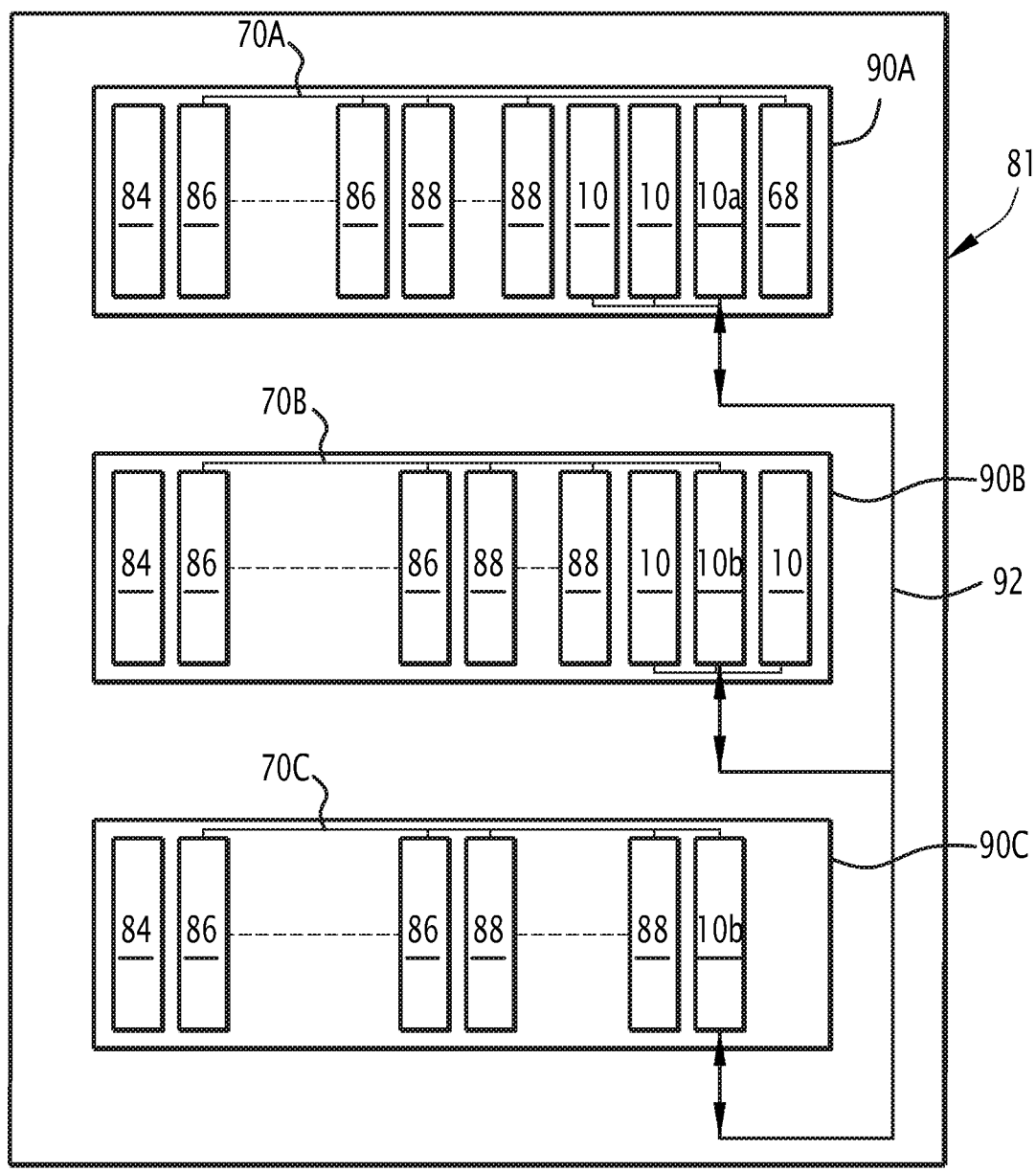

Three architecture variants of such a control device 81 are respectively shown in FIGS. 4 to 6.

In FIG. 4, the control device 81 is "mono-"programmable logic circuit 10. In other words, the control device 81 comprises a rack 82 forming a housing, for example of size 6U (U being the height unit of a rack), in which a single programmable logic circuit 10 is integrated. The rack 82 is suitable for further comprising a power module 84, and auxiliary modules, namely one or several modules 86 dedicated to the acquisition of distinct input data, and one or several modules 88 dedicated to the publication of distinct output data, and one or several service maintenance diagnosis modules 68 as previously described. Furthermore, the programmable logic circuit 10 comprises connectors (for example, seven connectors) allowing, for example using fiber optics, a connection to a communication network.

A connection of the application program 34 automatic generator 110 to the control device 81 is able to be established via the service maintenance diagnosis module(s) 68, which is in particular configured to load the sequence 46 of functional blocks to be executed into the control device 81 once such a connection is established.

Within the rack 82, the programmable logic circuit 10 is master and controls the communication with the auxiliary modules 86, 88 and 68 through a bus 70 using, by way of non-limiting example, Multipoint-Low Voltage Differential Signaling (M-LVDS), operating for example at 50 MHz, and respectively dedicated to the binary and analog input data and to the binary and analog output data of the programmable logic circuit 10. Advantageously, each type of data (input or output) has an independent transmission link for the binary data and the analog data. In this scenario, there are therefore four low-voltage differential transmission links.

Many embodiment variants will therefore be able to be implemented without going beyond the scope of the disclosure. For example, the modules 86 dedicated to the acquisition of input data, and the modules 88 dedicated to the publication of the output data, will be able to be housed on a same electronic board of the "GPIO" (general-purpose input output) type, already known.

The power module 84 delivers a power-stabilized power supply to the other modules of the rack 82 and is also configured to implement a voltage conversion, for example from 24 volts in direct current to 5 volts in order to power each module of the housing 82.

FIGS. 5 and 6 show two variants of control devices 81 comprising a plurality of programmable logic circuits 10 shown in FIG. 1.

Such a "multi-"programmable logic circuit 10 architecture makes it possible to increase the number of network interfaces per control device, to duplicate the control command operations in at least two programmable logic circuits 10 for safety control purposes imposing redundancy rules, or to optimize the inter-module routing within a housing 82.

In such a "multi-"programmable logic circuit architecture 10, the plurality of programmable logic circuits 10 is synchronized; this synchronization is done by means of a master logic circuit 10*a* from among the programmable logic circuits 10, connected to a clock.

The master programmable logic circuit 10*a* is in particular suitable for emitting, via the control module 12 of the signals shown in FIG. 1, a synchronization pulse at the beginning and/or end of the cycle (a cycle for example having a duration of 2 ms) and a status request toward the other modules 86 dedicated to distinct input data, the modules 88 dedicated to distinct output data, or to the other programmable logic circuits 10 in order to synchronize and refresh, upon each cycle, the input/output data of the following cycle (new iteration of the same command control application). As a result, unlike the exchanges via communication networks, these data exchanges within a same plurality of programmable logic circuits are done on a synchronous mode.

Thus, all of the programmable logic circuits 10 of the plurality are configured to operate simultaneously within a same cycle.

Two non-limiting variants of such a "multi-"programmable logic circuit architecture 10 are shown in FIGS. 5 and 6 as an illustration.

In FIG. 5, three programmable logic circuits, comprising a master programmable logic circuit 10*a* and two other programmable logic circuits 10, are housed in the same rack 82, the programmable logic circuits 10 and 10*a* being suitable for communicating with one another and with the auxiliary modules 86, 88, 68 of the rack 82 synchronously. In the embodiment shown by FIG. 5, the programmable logic circuits 10*a* and 10 communicate with one another synchronously by fiber optics 92, connectors being specifically dedicated to this inter-programmable logic circuit communication within a "multi-"circuit architecture. Furthermore, the master programmable logic circuit 10*a* communicates synchronously with the auxiliary modules 86, 88, 68 of the rack 82 using the bus 70.

In FIG. 6, a "multi-"programmable logic circuit 10*a* and 10 and "multi-"rack 90A, 90B, 90C control device 81 architecture is shown. According to this multi-circuit and multi-rack architecture, each rack 90A, 90B, 90C corresponds to an arrangement described in FIG. 4 (Mono-Circuit) or in FIG. 5 (Multi-Circuit).

Each rack may further comprise auxiliary modules 86, 88, 68.

Preferably, one of the racks 90A is "master" and comprises the master programmable logic circuit 10*a* for all of the programmable logic circuits 10 of the multi-circuit and multi-rack control device 81, and ensuring the synchronization of the auxiliary modules 86, 88, 68 of its housing via the bus 70A.

The programmable logic circuits 10 of the control device 81 are suitable for communicating from one rack to the other and within a same rack synchronously by fiber optics 92.

Each "slave" rack 90B, 90C of the master rack 90A comprises, among its programmable logic circuits 10, a synchronization programmable logic circuit 10*b* for synchronizing the auxiliary modules 86, 88, 68 of its rack by means of the bus 70B, 70C of the rack.

In the embodiments of FIGS. 5 and 6, and without this being a limitation with respect to the scope of the disclosure, a single service maintenance diagnosis module 68 is implemented per control device 81, independently of the number of programmable logic circuit(s) 10 or the number of rack(s) that it comprises.

In the embodiments of FIGS. 5 and 6, and without this being a limitation with respect to the scope of the disclosure, only the master programmable logic circuit 10a and the synchronization programmable logic circuits 10b are connected to the auxiliary modules 86, 88, 68 of their respective rack 90A, 90B, 90C by means of their respective bus 70A, 70B, 70C. The other programmable logic circuits 10 of a rack are connected to the auxiliary modules 86, 88, 68 of their rack by means, respectively, of the master programmable logic circuit 10a or the synchronization programmable logic circuit 10b, and the fiber-optic network 92. In this configuration, a bus 70A, 70B, 70C advantageously comprises four Multipoint-Low Voltage Differential Signaling (M-LVDS) links, for example operating at 50 MHz, in each transmission direction.

In another embodiment, the buses 70A, 70B, 70C can be dimensioned to allow each programmable logic circuit 10 to be connected to the auxiliary modules 86, 88, 68 of its rack through the bus 70A, 70B, 70C.

What is claimed is:

1. A programmable logic circuit for controlling an electrical facility, the programmable logic circuit comprising an operating unit comprising:
   a plurality of types of functional blocks, two distinct types of the functional blocks being configured for executing at least one distinct function;
   at least one processing module configured for receiving at least one sequence of the functional block(s) to be executed; and
   at least one internal memory configured to store at least the sequence, the programmable logic circuit including a single functional block of each type of the functional blocks, a given functional block being configured for being called several times, and an execution module configured to execute at least one called functional block in series, according to the sequence.

2. The programmable logic circuit according to claim 1, wherein the programmable logic circuit is of a FPGA type.

3. The programmable logic circuit according to claim 1, wherein the execution module is a finite-state machine.

4. The programmable logic circuit according to claim 1, wherein the operating unit further comprises a plurality of parallelizable floating point units.

5. The programmable logic circuit according to claim 1, wherein the at least one processing module is configured for receiving an application program corresponding to a group of computer configuration files comprising the sequence and at least one other computer file belonging to the group comprising:
   a configuration file of the memory corresponding to a table associating, with at least one input/output signal of the programmable logic circuit, an address in its memory,
   a file with value(s) of parameter(s) of functional block(s) configured for executing at least one function using a parameter,
   a file listing, for each functional block, the address or addresses of the memory allocated to one or more input(s) of this functional block,
   a file listing, for each functional block, the address or addresses of the memory allocated to one or more output(s) of this functional block.

6. The programmable logic circuit according to claim 5, wherein the parameter values are sequenced within their file as a function of the sequence of functional block(s) to be executed.

7. The programmable logic circuit according to claim 1, wherein the memory comprises at least two data storage areas respectively dedicated to binary data and analog data.

8. The programmable logic circuit according to claim 7, wherein each storage area comprises at least three dedicated subareas:
   at least one subarea dedicated to the input data of the programmable logic circuit,
   at least one subarea dedicated to the output data of the programmable logic circuit, and
   at least one subarea dedicated to temporary data obtained during execution of the sequence.

9. The programmable logic circuit according to claim 8, wherein the subareas dedicated to the input data or the subareas dedicated to the output data are synchronous flip-flop registers.

10. A control device for controlling an electrical facility, wherein the control device comprises at least one programmable logic circuit according to claim 1.

11. The control device according to claim 10, wherein the control device comprises a plurality of the programmable logic circuits.

12. The control device according to claim 11, comprising a fiber-optic communication network configured to link the plurality of programmable logic circuits.

13. The control device according to claim 12, wherein a master programmable logic circuit, among the plurality of programmable logic circuits, is configured for being connected to a clock and is configured to synchronize the other programmable logic circuits of the plurality of programmable logic circuits by means of the fiber-optic communication network.

14. The control device according to claim 13, wherein the master programmable logic circuit is also configured to synchronize the auxiliary modules by the communication bus.

15. The control device according to claim 11, wherein the plurality of programmable logic circuits is housed in a same rack.

16. The control device according to claim 11, wherein the programmable logic circuits of the plurality of programmable logic circuits are separated in at least two distinct racks.

17. The control device according to claim 10, further comprising:
   at least one power module;
   auxiliary modules among one or several modules dedicated to acquiring distinct input data, one or several modules dedicated to publishing distinct output data, and one or several service maintenance diagnosis modules; and
   a communication bus configured to link the at least one programmable logic circuit to the auxiliary modules.

18. The control device according to claim 17, wherein the communication bus comprises four multipoint-low voltage differential signaling links respectively dedicated to the input data and the output data of each programmable logic circuit in each transmission direction.

* * * * *